(12) United States Patent
Kobrinsky et al.

(10) Patent No.: US 7,402,509 B2
(45) Date of Patent: Jul. 22, 2008

(54) METHOD OF FORMING SELF-PASSIVATING INTERCONNECTS AND RESULTING DEVICES

(75) Inventors: Mauro J. Kobrinsky, Portland, OR (US); Jun He, Portland, OR (US); Kevin O'Brien, Portland, OR (US); Patrick Morrow, Portland, OR (US); Ying Zhou, Tigard, OR (US); Shriram Ramanathan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 309 days.

(21) Appl. No.: 11/081,187

(22) Filed: Mar. 16, 2005

(65) Prior Publication Data

US 2006/0220197 A1 Oct. 5, 2006

(51) Int. Cl.
*H01L 23/52* (2006.01)
*H01L 21/44* (2006.01)
(52) U.S. Cl. .................................... 438/613; 257/737
(58) Field of Classification Search ................. 257/737; 438/613

See application file for complete search history.

(56) References Cited

U.S. PATENT DOCUMENTS

2004/0108363 A1    6/2004   Giraudet
2004/0219763 A1   11/2004   Kim et al.
2004/0232537 A1   11/2004   Kobrinsky et al.
2004/0262772 A1   12/2004   Ramanathan et al.
2005/0003650 A1 *  1/2005   Ramanathan et al. ....... 438/614
2005/0003652 A1 *  1/2005   Ramanathan et al. ....... 438/616

FOREIGN PATENT DOCUMENTS

WO    WO 2005/001933 A1    1/2005

OTHER PUBLICATIONS

PCT Search Report Dated Aug. 10, 2006.
K-A Son et al., "Growth and Oxidation of Thin Film Al2Cu", Journal of Electrochemical Society, vol. 148, No. 7, 2001, pp. B260-B263.
K. Banerjee et al., "3-D ICs: A Novel Chip Design for Improving Deep-Submicrometer Interconnect Performance and Systems-on-Chip Integration".
Proc. of the IEEE, New York, US, vol. 89, No. 5, May 2001, pp. 602-633.
Pending U.S. Appl. No. 10/683,202, not yet published, filed Oct. 9, 2003 to Patrick Morrow et al.

* cited by examiner

*Primary Examiner*—Kiesha L Rose
(74) *Attorney, Agent, or Firm*—Kenneth A. Nelson

(57) ABSTRACT

A method of forming self-passivating interconnects. At least one of two mating bond structures is formed, at least in part, from an alloy of a first metal and a second metal (or other element). The second metal is capable of migrating through the first metal to free surfaces of the mating bond structures. During bonding, the two mating bond structures are bonded together to form an interconnect, and the second metal segregates to free surfaces of this interconnect to form a passivation layer. Other embodiments are described and claimed.

32 Claims, 9 Drawing Sheets

METHOD OF FORMING SELF-PASSIVATING INTERCONNECTS AND RESULTING DEVICES

FIELD OF THE INVENTION

The disclosed embodiments relate generally to the formation of interconnects for integrated circuit devices and, more particularly, to the formation of self passivating interconnect structures.

BACKGROUND OF THE INVENTION

Three-dimensional wafer bonding, or wafer stacking, is the bonding together of two or more semiconductor wafers upon which integrated circuitry has been formed. The wafer stack that is formed is subsequently diced into separate stacked die, each stacked die having multiple layers of integrated circuitry. Wafer stacking may offer a number of potential benefits. For example, integrated circuit (IC) devices formed by wafer stacking may provide enhanced performance and functionality while perhaps lowering costs and improving form factors. System-on-chip (SOC) architectures formed by wafer stacking can enable high bandwidth connectivity between stacked die with dissimilar technologies—e.g., logic circuitry and dynamic random access memory (DRAM)—that otherwise have incompatible process flows. Also, by using three-dimensional wafer bonding, smaller die sizes may be achieved, which can reduce interconnect delays. There are many potential applications for wafer stacking technology, including high performance processing devices, video and graphics processors, high density and high bandwidth memory chips, the aforementioned SOC solutions, as well as others.

One method for three-dimensional wafer bonding is metallic bonding. In metallic wafer bonding, two wafers are joined by bonding metal bond structures formed on one of the wafers with corresponding metal bond structures formed on the other wafer. For example, a number of copper bond pads may be formed on a first wafer and a corresponding number of copper bond pads may be formed on a second wafer. The first and second wafers are aligned and brought together, such that each of the copper pads on the first wafer mates with a corresponding one of the copper pads on the second wafer. A bonding process is then performed (e.g., as by application of pressure and/or elevated temperature) to join the mating bond pads, thereby forming a plurality of interconnects between the first and second wafers, which now form a wafer stack. Each of the first and second wafers includes integrated circuitry for a plurality of die, and the wafer stack is cut into a number of stacked die. Each stacked die comprises one die from the first wafer and another die from the second wafer, these die being mechanically and electrically coupled by some of the previously formed interconnects.

DETAILED DESCRIPTION OF THE INVENTION

Figure 1:
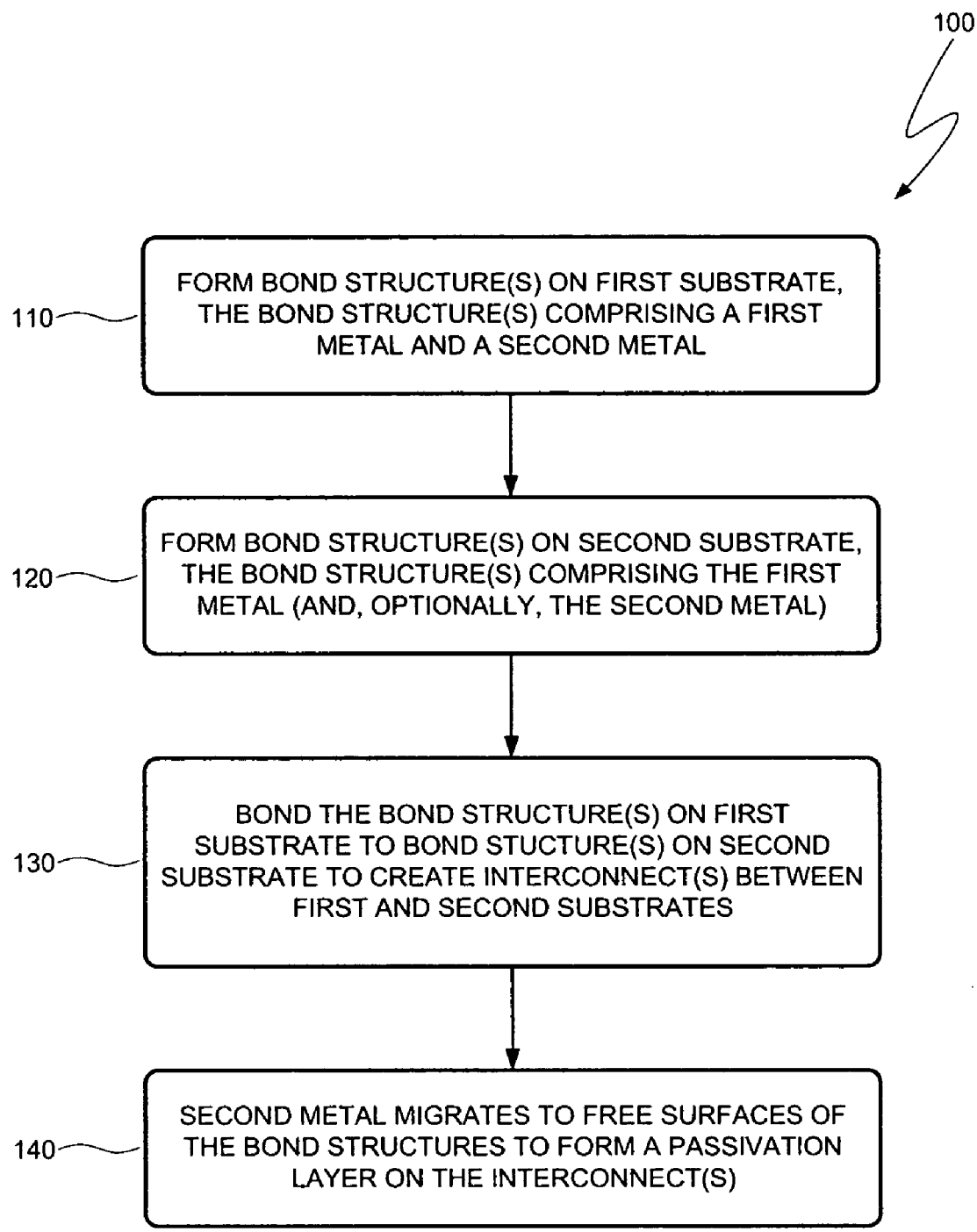
FIG. 1 is a schematic diagram illustrating an embodiment of a method of forming self-passivating interconnects.

Referring to FIG. 1, illustrated is an embodiment of a method of forming self-passivating interconnects. Embodiments of the method of FIG. 1 are further illustrated in FIGS. 2A-2D, as well as FIGS. 3A-3C and FIG. 4, and reference should be made to these figures as called out in the text below.

Figure 2A:
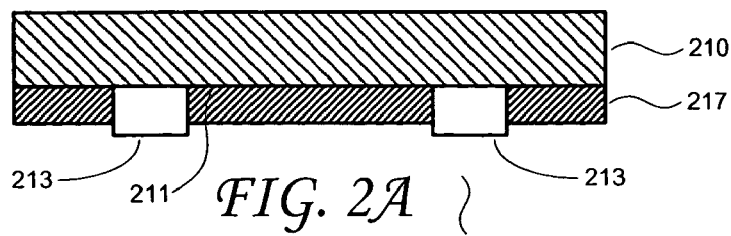
FIGS. 2A-2D are schematic diagrams illustrating embodiments of the method of FIG. 1.

With reference now to block 110 in FIG. 1, one or more bond structures are formed on a first substrate, each of these bond structures comprising, at least in part, a first metal and a second metal (or other element). This is illustrated in FIG. 2A, which shows a first substrate 210 having a surface 211 upon which a number of bond structures 213 have been formed. Each of the bond structures 213 may be electrically coupled with a conductor formed in the substrate 210. In one embodiment, the substrate 210 comprises a semiconductor wafer upon which integrated circuitry has been formed for a number of die. A layer of dielectric material 217 may also be disposed on the surface 211 of first substrate 210. The dielectric layer 217 may comprise any suitable dielectric material, such as $SiO_2$, $Si_3N_4$, Carbon-doped Oxide (CDO), SiOF, or a spun-on material (e.g., a spun-on glass or polymer). In one embodiment, the bond structures 213 extend above an outer surface of the dielectric layer 217 (e.g., as may be achieved by polishing or etching back the dielectric layer).

As noted above, the bond structures 213 comprise, at least in part, an alloy of a first metal and a second metal (or other element). The first metal comprises an electrically conductive metal that will ultimately form part of an electrically conductive interconnect. In one embodiment, the first metal comprises copper. However, the first metal may comprise any other suitable electrically conductive metal (e.g., aluminum, gold, silver, etc.) or conductive metal alloy, Also, as suggested above, only a portion of each bond structure 213 may comprise an alloy of the first and second metals, whereas other portions of the bond structures may comprise substantially the first metal, as will be explained below in greater detail with respect to FIGS. 3A-3C.

The second metal or element comprises any metal (or other material) having the ability to form a passivation layer over the interconnect that is to be formed. In one embodiment, the second metal comprises a substance that can diffuse through the first metal, such that the second metal can migrate to free surfaces of the interconnect structure to form the passivation layer. Metals believed suitable for the second metal include, but are not limited to, aluminum, cobalt, tin, magnesium, and titanium. In one embodiment, the second element comprises a non-metal. According to one embodiment, the amount of the second metal (or element) present in the alloy (of the first and second metals) is at or below the solubility limit of the second metal in the first metal. In one embodiment, the content of the second metal in the metal alloy is between 0.1 and 10 atomic percent. For example, should the first metal comprise copper and the second metal aluminum, the amount of aluminum present in the Cu(Al) alloy is up to approximately 3 atomic percent.

According to another embodiment, at room temperature, the diffusion mechanism that enables migration of the second metal (or element) within the first metal is slow or substantially non-existent, such that the second metal is "trapped" within the lattice structure of the first metal, which can prevent early formation of the passivation layer. Premature formation of the passivation layer (e.g., before bonding of the bond structures 213 with the bond structures of a second substrate, as will be described below) can potentially hinder metallic bonding. At elevated temperature, however, the second metal (or element) is able to diffuse through the first metal, such that the second metal can segregate to the free surfaces of the interconnect structure to form a passivation layer. The tendency of some metals, when alloyed with another metal, to migrate to free surfaces is a well known phenomena and is not discussed further.

In a further embodiment, the bond structure 213 comprises the first metal and two or more additional metals (or other elements). Each of these additional metals (or elements) comprises a substance that can diffuse through the first metal to form the passivation layer. Thus, the passivation layer may comprise a combination of the two (or more) additional metals or other elements.

In one embodiment, the passivation layer is formed in the presence of an environment including oxygen, and the passivation layer comprises an oxide of the second metal (e.g., $Al_2O_3$). According to another embodiment, the passivation layer is formed in the presence of an environment including nitrogen, and the passivation layer comprises a nitride of the second metal (e.g., AlN). In yet another embodiment, the passivation layer comprises substantially the second metal (or other material).

Figure 2B:
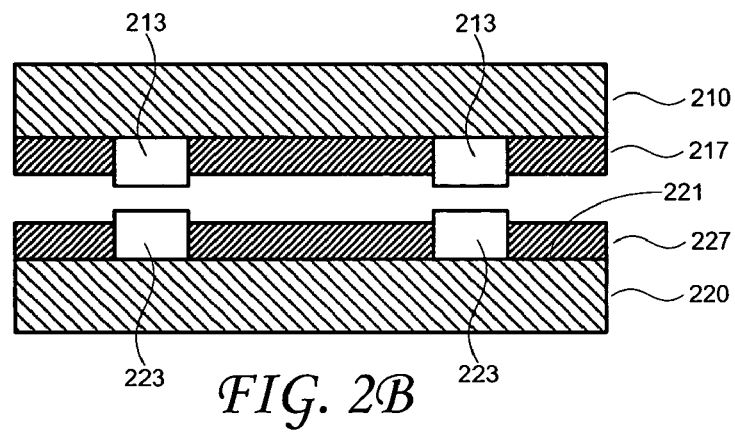
Figure 2C:
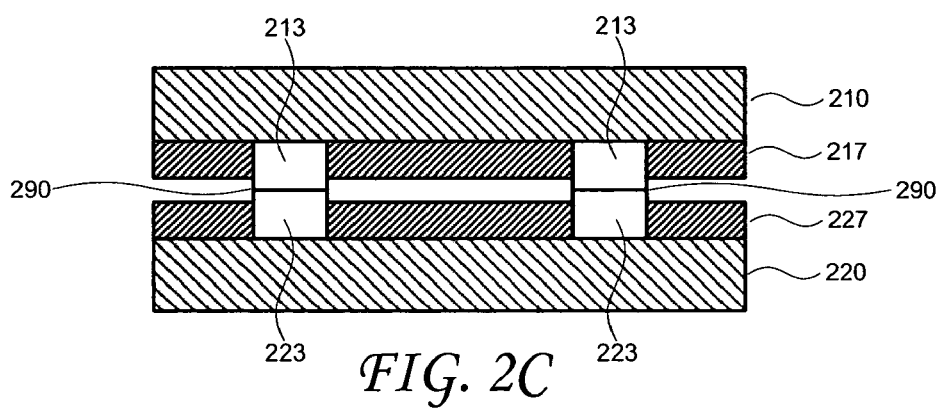

Referring to block 120 in FIG. 1, one or more bond structures are formed on a second substrate, each of these bond structures comprising the first metal. The bond structures on the second substrate may optionally include the second metal (or other element or elements), such that at least a portion of each bond structure comprises an alloy of the first and second metals. This is illustrated in FIG. 2B, which shows a second substrate 220 having a surface 221 upon which a number of bond structures 223 have been formed. Each of the bond structures 223 may be electrically coupled with a conductor formed in the substrate 220. In one embodiment, the substrate 220 comprises another semiconductor wafer upon which integrated circuitry has been formed for a corresponding number of die. A layer of dielectric material 227 may also be disposed on the surface 221 of second substrate 220. The dielectric layer 227 may comprise any suitable dielectric material, such as $SiO_2$, $Si_3N_4$, CDO, SiOF, or a spun-on material (e.g., a spun-on glass or polymer). In one embodiment, the bond structures 223 extend above an outer surface of the dielectric layer 227 (e.g., as may be achieved by polishing or etching back the dielectric layer).

The bond structures 223 on second substrate 220 will be aligned and mated with the bond structures 213 on first substrate 210, and a bonding process will be performed to form interconnects between the first and second substrates. Each of these interconnects will be formed from a bond structures 213 on first substrate 210 and a mating bond structure 223 on second substrate 220, and a passivation layer will be formed over each interconnect from the second metal (or element or combination of other metals and/or elements). As noted above, the bond structures 223 on second substrate may comprise substantially the first metal (without the second metal). According to this embodiment, just one of the mating bond structures (e.g., bond structure 213 or, perhaps, bond structure 223) includes the second metal, and the passivation layer is formed from the second metal present in this one bond structure. According to another embodiment, however, the bond structures 223 on second substrate 220 comprise, at least in part, an alloy of a first metal and a second metal. Thus, the passivation layer that is ultimately created on each interconnect is formed from the second metal that is present in each of the mating bond structures 213, 223 of the first and second substrates 210, 220, respectively. The characteristics of the first and second metals (or elements) were described above.

The bond structures 213, 223 on the first and second substrates 210, 220 may have any suitable shape, so long as a bond structure 213 on first substrate 210 can be mated and bonded to a bond structure 223 on second substrate 220 to form an interconnect extending between these two substrates. In one embodiment, each of the bond structures 213, 223 comprises a circular-shaped or a square-shaped bond pad. However, it should be understood that the disclosed embodiments are not limited to the formation of such bond pads and, further, that the bond structures 213, 223 may comprise any other suitable shape (e.g., spherical bumps). In one embodiment, the bond structures 213, 223 have a thickness T (see FIG. 3A) of between 0.1 μm and 10 μm. The bond structures 213, 223 may also be formed by any suitable process or processes. Various embodiments of the bond structures 213, 223 are described below in greater detail with respect to FIGS. 3A-3C.

Returning again to FIG. 1, and block 130 in particular, the bond structures of the first and second substrates are aligned and brought into contact for bonding, such that the bond structures on the first substrate can be bonded with the bond structures on the second substrate to form interconnects between the first and second substrates. This is further illustrated in FIG. 2C, where the first and second substrates 210, 220 have been aligned and brought together for bonding. Each of the bond structures 213 on first substrate 210 has been aligned and mated with a corresponding one of the bond structures 223 on the second substrate 220.

Figure 3A:
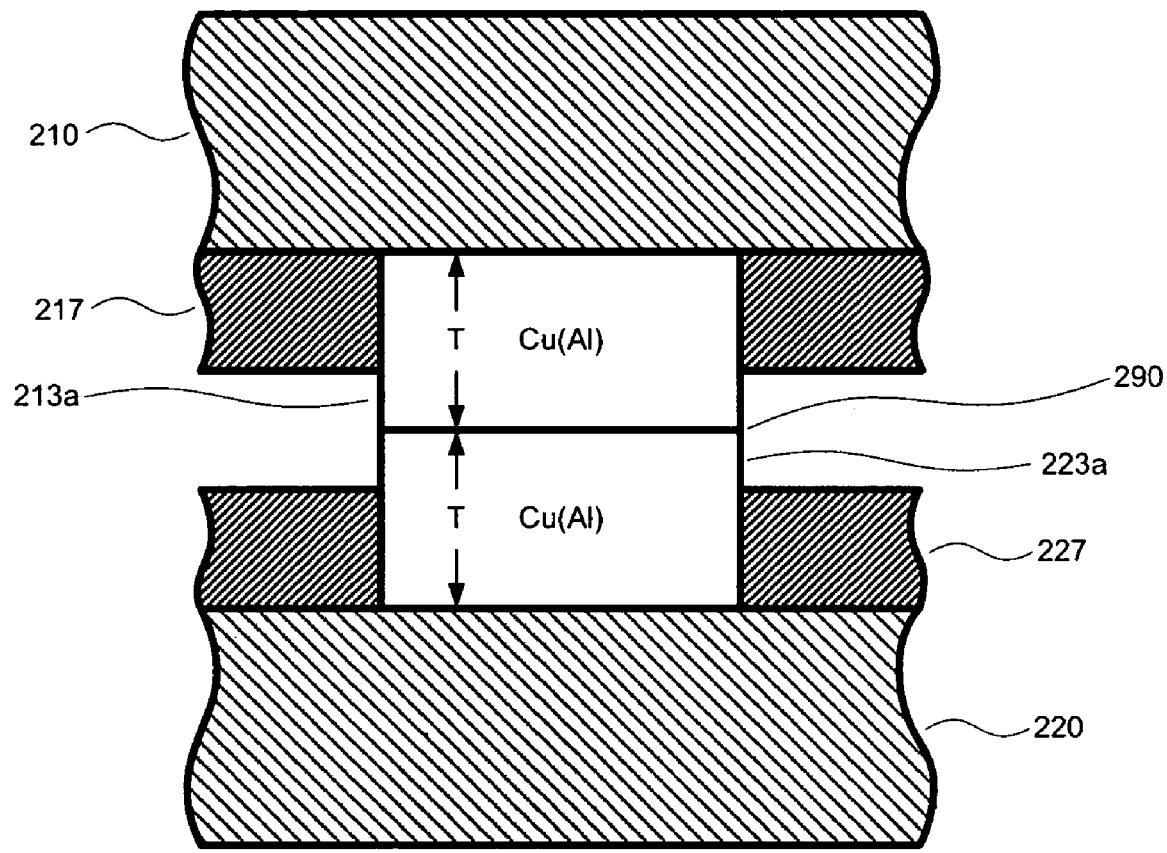
FIGS. 3A-3C are schematic diagrams illustrating various embodiments of bond structures which may be used to form self-passivating interconnects.
Figure 3B:
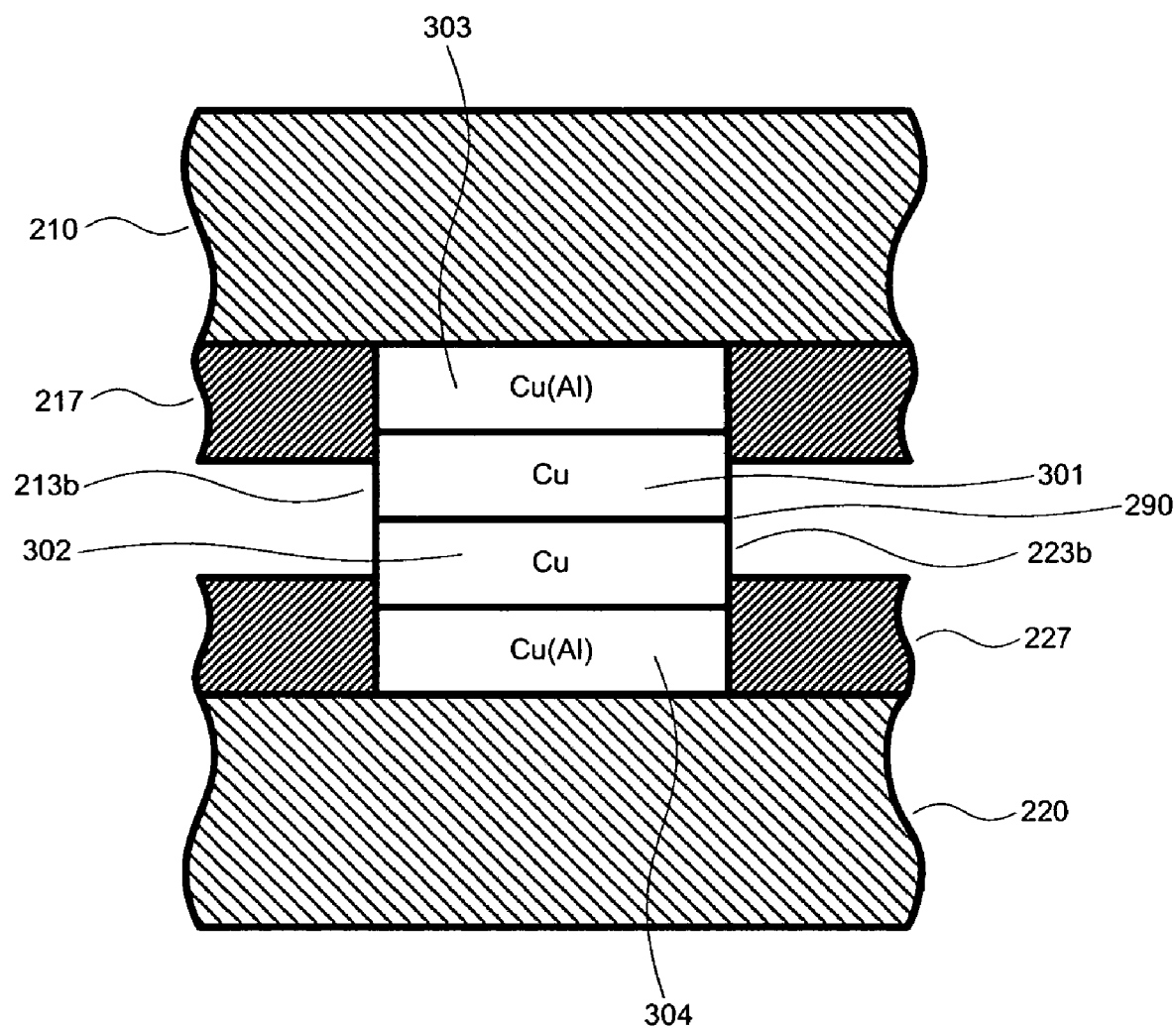
Figure 3C:
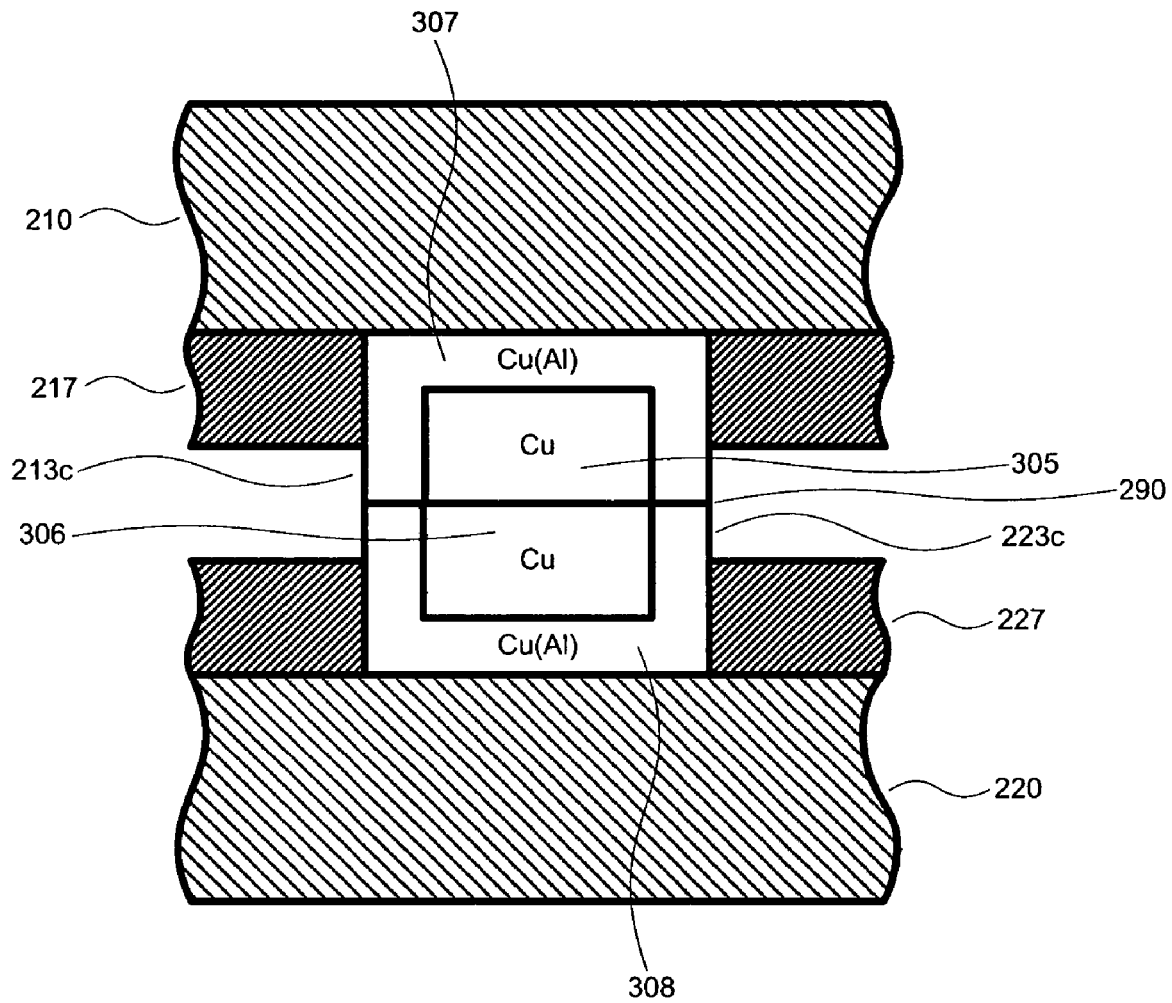

Various embodiments of the bond structures 213, 223, after alignment and contact, are illustrated in FIGS. 3A through 3C. Turning first to FIG. 3A, embodiments of bond structures 213a, 223a are shown. The entire bond structures 213a, 223a (or a substantial portion of these structures) comprise an alloy of the first and second metals (e.g., an alloy of copper and aluminum). The bond structures 213a may be formed by first depositing the layer of dielectric material 217 over the substrate 210, and then forming vias or other apertures (e.g., as by a mask and etching process) into the dielectric layer 217 at locations of the bond structures. The alloy of the first and second metals is then deposited in the vias (e.g., as by a blanket deposition step followed by a planarization step, such as chemical-mechanical polishing) to form the bond structures 213a. The dielectric layer 217 may also be polished or etched back to expose the upper portion of the bond structure, as shown in FIG. 3A. The bond structures 223a on substrate 220 may be formed in a similar fashion.

Referring to FIG. 3B, further embodiments of bond structures 213b, 223b are illustrated. The bond structure 213b includes an upper portion 301 that comprises substantially the first metal (e.g., copper), as well as a lower portion 303 that comprises an alloy of the first and second metals (e.g., copper and aluminum). Similarly, the bond structure 223b includes an upper portion 302 that comprises substantially the first metal and a lower portion 304 comprising the alloy of the first and second metals. The bond structure 213b may be formed by first depositing the layer of dielectric material 217 over the substrate 210, and then forming vias or other apertures (e.g., as by a mask and etching process) into the dielectric layer 217 at locations of the bond structures. A layer of the alloy of the first and second metals is then deposited in the vias (e.g., as by selective deposition onto conductors in substrate 210 that underlie locations of the bond structures) to form the lower portion 303 of the bond structure. A layer of the first metal is then deposited over the alloy layer (e.g., as by selective deposition onto the alloy layer previously deposited in each via and, perhaps, a subsequent planarization step) to form the upper portion 301 of the bond structures 213a. The dielectric layer 217 may also be polished or etched back to expose the upper portion of the bond structure, as shown in FIG. 3B. The bond structures 223b on substrate 220 may be formed in a similar manner.

Referring next to FIG. 3C, additional embodiments of bond structures 213c, 223c are shown. The bond structure 213c includes an interior portion 305 comprised of substantially the first metal (e.g., copper). The interior portion 305 of bond structure 213c is surrounded by an outer portion 307 comprised of an alloy of the first and second metals (e.g., copper and aluminum). Similarly, the bond structure 223c includes an interior portion 306 comprised substantially of the first metal, with the interior portion 306 being surrounded by an outer portion 308 that is comprised of the alloy of the first and second metals. The bond structure 213c may be formed by first depositing the layer of dielectric material 217 over the substrate 210, and then forming vias or other apertures (e.g., as by a mask and etching process) into the dielectric layer 217 at locations of the bond structures. A seed layer of the alloy of the first and second metals may then be deposited in the vias (e.g., as by a blanket deposition process) to form the outer portion 307 of the bond structure. A layer of the first metal is then deposited over the alloy layer (e.g., as by a subsequent blanket deposition step, which may be followed by a planarization step) to form the interior portion 305 of the bond structures 213c. The dielectric layer 217 may also be polished or etched back to expose the upper portion of the bond structure, as shown in FIG. 3C. The bond structures 223c on substrate 220 may be formed in a similar manner.

In each of FIGS. 3A-3C, the bond structures 213, 223 are the same. It should be understood, however, that the bond structures on the first and second substrates 210, 220 may not be the same. For example, the first substrate 210 may have bond structures similar to those shown in FIG. 3A, whereas the second substrate 220 may have bond structures similar to those shown in FIG. 3B. By way of further example, the first substrate 210 may have bond structures similar to those shown in any one of FIGS. 3A through 3C, whereas the second substrate 220 may have bond structures that are substantially comprised of the first metal (e.g., copper). The reader will appreciate that any combination of mating bond structures may be used, depending upon the desired characteristics and operating environment of the interconnects that are to be formed.

During bonding, the bond structures 213 on first substrate 210 are to be bonded with the bond structures 223 on second substrate 220 to form interconnects extending between these two substrates. For optimal bonding, it may in some embodiments be desirable to inhibit formation of a passivation layer at the interfaces between the bond structures 213, 223 (see reference numeral 290 in FIGS. 2C, 3A-3C, and 4). Thus, according to one embodiment, it may be desirable to delay migration of the second metal to the interface surfaces of the bond structures 213, 223 until bonding between the bond structures has been achieved. This may, in one embodiment, be accomplished by placing at interface 290 material that comprises substantially the first metal (e.g., copper). Each of FIGS. 3B and 3C are examples of bond structures (213b, 223b and 213c, 223c) which provide a layer (or quantity) of the first metal at the interface 290 between the bond structures. This layer (or quantity) of first metal at the interface 290 essentially serves as a delay function that slows the migration of the second metal to the interface prior to bonding. In yet another embodiment, one or more additional layers of metal (or other element) may be disposed between the metal layers to further delay migration of the second metal to the interface prior to bonding (e.g., in each of FIGS. 3B and 3C, an additional layer of material may be disposed between the Cu(Al) and Cu layers).

Figure 4:
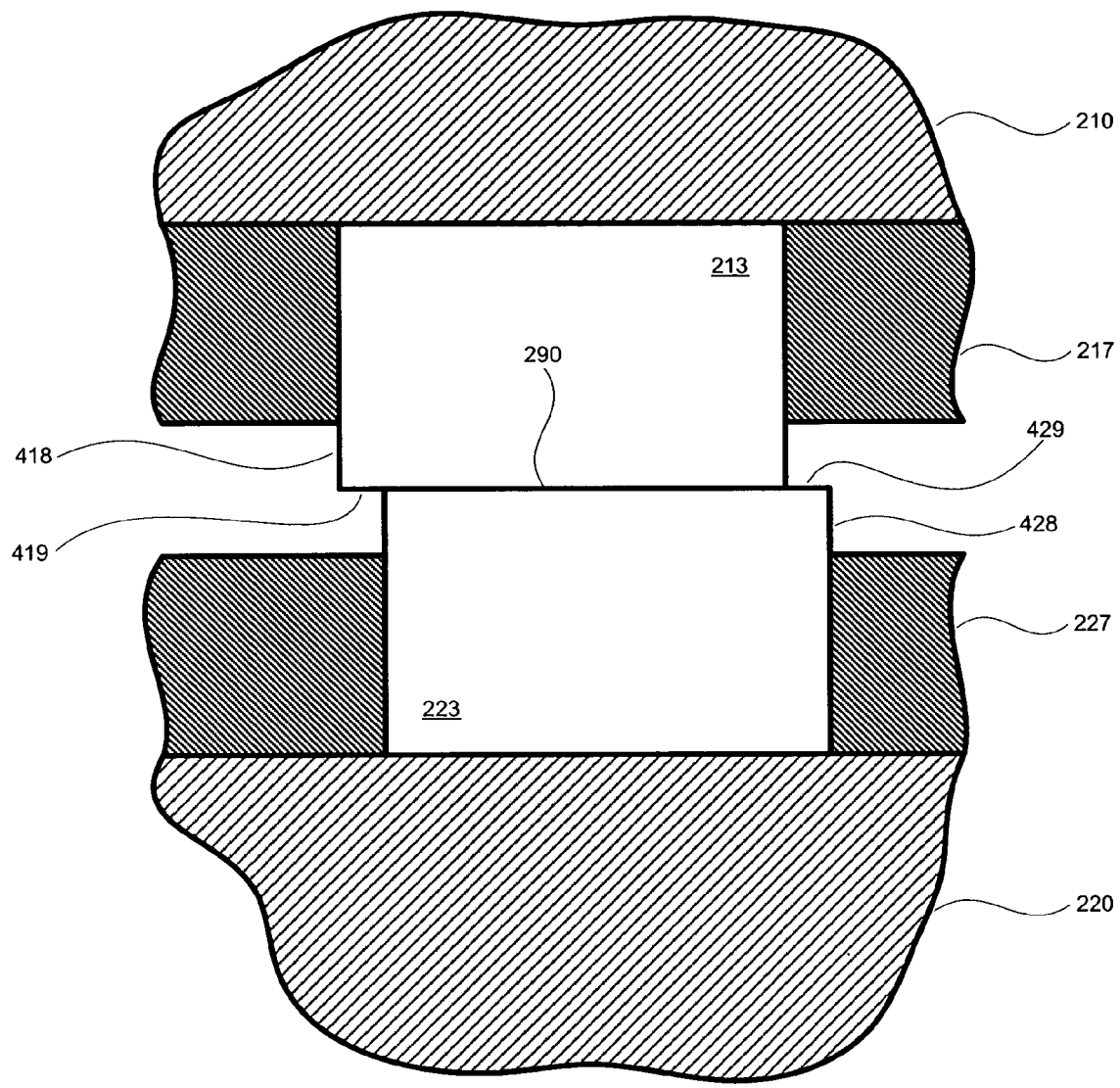
FIG. 4 is a schematic diagram illustrating an embodiment of the alignment and bonding of two bond structures, as shown in FIG. 2C.

The alignment of two bond structures 213, 223 is further illustrated in FIG. 4. Referring to this figure, when two of the bond structures 213, 223 are aligned and placed in contact, there will be a number of free surfaces (e.g., an exterior surface of a bond structure) exposed to the ambient environment. These exposed free surfaces include surfaces 418, 428 of the bond structures 213, 223 that extend above their respective dielectric layers 217, 227. In addition, due to misalignment between the bond structures 213, 223, exposed free surfaces 419, 429 may also exist at the interface 290. After bonding of the bond structures 213, 223 to form an interconnect, these free surfaces 418, 428, 419, 429 may remain exposed to the external environment, making them susceptible to oxidation and corrosion. However, the passivation layer that is to be formed during or after bonding (from migration of the second metal to these free surfaces) can inhibit such oxidation and corrosion (although the passivation layer itself may be formed, in part, by an oxidation process).

Bonding may take place under any suitable process conditions. In one embodiment, the bond structures 213, 223 on the first and second substrates 210, 220 are brought in contact under pressure and subjected to an elevated temperature. According to one embodiment, the contact pressure between the bond structures 213, 223 is in a range up to 5 MPa, and bonding is performed at a temperature up to 450 degrees Celsius. The ambient environment in which bonding occurs may also affect bonding, as well as the formation of the passivation layer. In one embodiment, bonding is performed in an atmosphere including oxygen, in which case the passivation layer formed may be an oxide of the second metal (e.g., $Al_2O_3$). In another embodiment, bonding is performed in an atmosphere including nitrogen, and the passivation layer formed may be a nitride of the second metal (e.g., AlN). In a further embodiment, bonding is performed under a vacuum, and the passivation layer formed may comprise substantially the second metal (although subsequent oxidation of the passivation layer may occur if the bonded substrates are not hermetically sealed). These are but a few examples of the conditions under which bonding may be performed, and the reader will appreciate that other process conditions may be employed, depending upon the desired characteristics of the interconnects being formed.

Figure 2D:
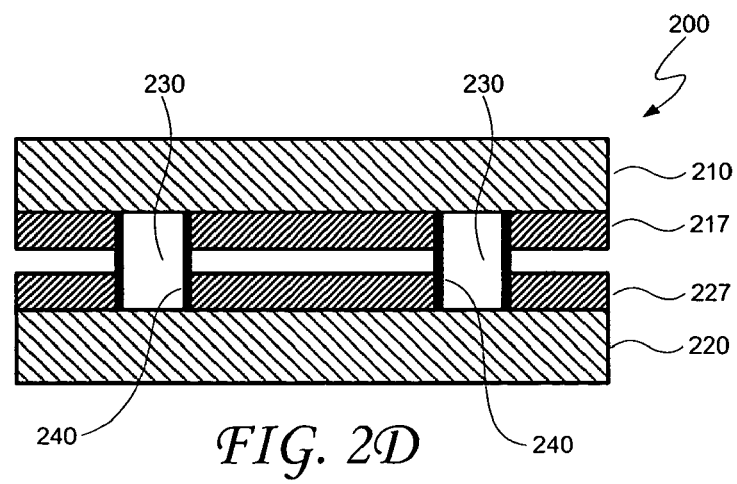

During bonding, two process should occur: (1) the formation of a metallic bond between the mating bond structures 213, 223 to form interconnects extending between the first and second substrates 210, 220 (see block 130); and (2) migration of the second metal to free surfaces (see FIG. 4) of the bond structures 213, 223 to form a passivation layer over each of the interconnects, as is set forth in block 140 of FIG. 1. This is further illustrated in FIG. 2D, which shows interconnects 230 that have been formed from the mating bond structures 213, 223, which are now bonded to one another. As also shown in FIG. 2D, a passivation layer 240 has been formed over each of the interconnects 230, this passivation layer 240 being formed from the second metal (e.g., either an oxide or nitride of the second metal, or perhaps formed substantially of the second metal). In one embodiment, each of the interconnects 230 comprises substantially the first metal; however, in other embodiments, some of the second metal may remain within the interconnects 230 (e.g., some of the second metal may remain "trapped" in the lattice structure of the first metal because bonding was stopped prior to segregation of all of the second metal to the free surfaces). The two aforementioned processes—e.g., bonding and passivation layer formation—may, in one embodiment, occur simultaneously (or nearly simultaneous). In other embodiments, however, these two processes may occur sequentially (e.g., bonding may occur first followed by migration of the second metal to the free surfaces and formation of a passivation layer).

The thickness of the passivation layer 240 will be a function of the choice of the first and second metals, as well as the processing conditions under which this layer forms (e.g., the atmosphere, temperature and time, etc.). This thickness may be specified to achieve desired characteristics for the passivation layer 240 (e.g., corrosion resistance, electromigration resistance, electrical isolation, etc.). According to one embodiment, the passivation layer 240 on the interconnects 230 has a thickness of between approximately 5 and 1,000 Angstroms. For example, where the passivation layer 240 comprises $Al_2O_3$ (and the interconnect substantially copper), the passivation layer may have a thickness of approximately 30 Angstroms. By way of further example, where the passivation layer 240 comprises AlN (and the interconnect substantially copper), the passivation layer may have a thickness of approximately 100 Angstroms. The reader will appreciate that other thicknesses can be achieved, as desired.

Figure 5A:
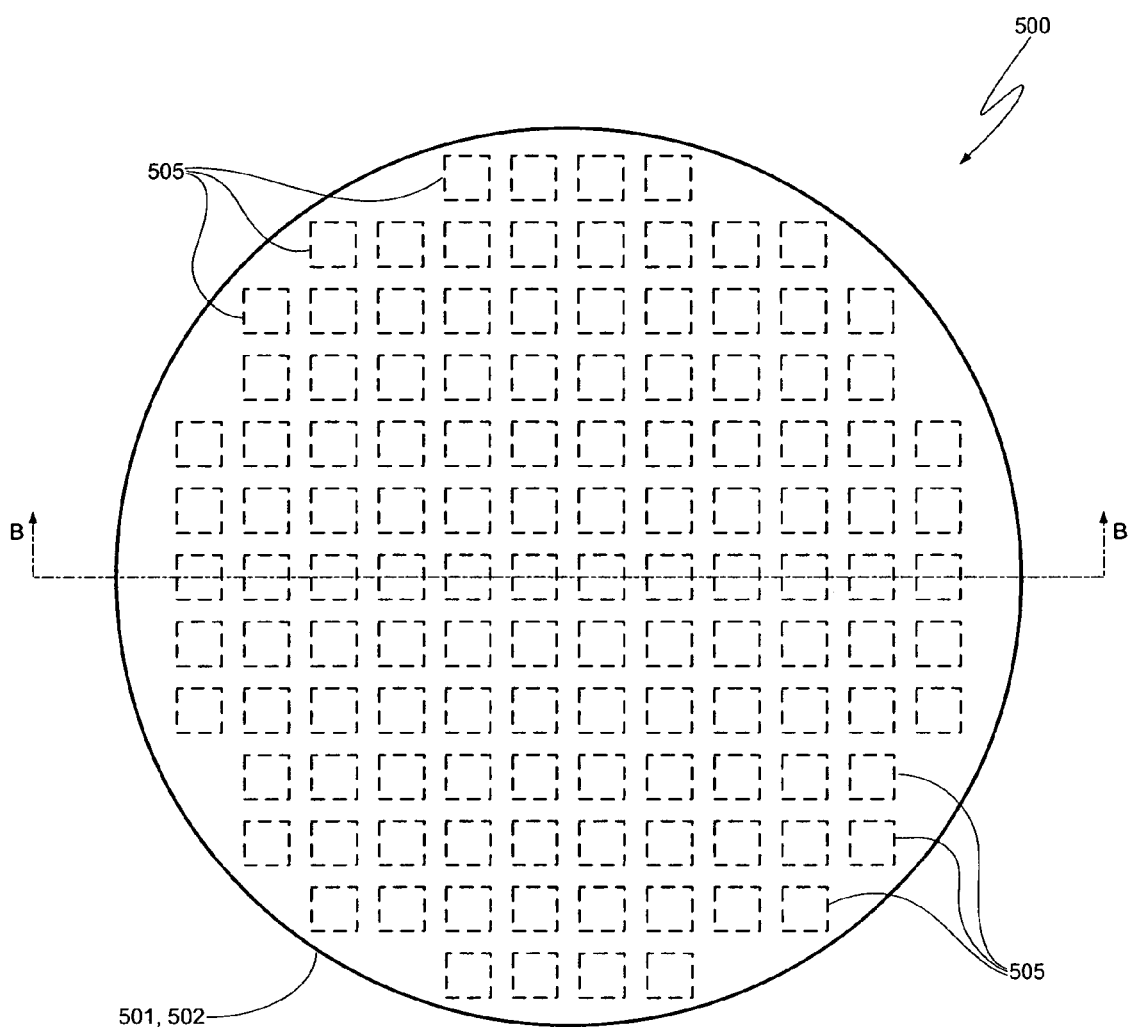
FIG. 5A is a schematic diagram illustrating an embodiment of a wafer stack, which may include self-passivating interconnects.
Figure 5B:
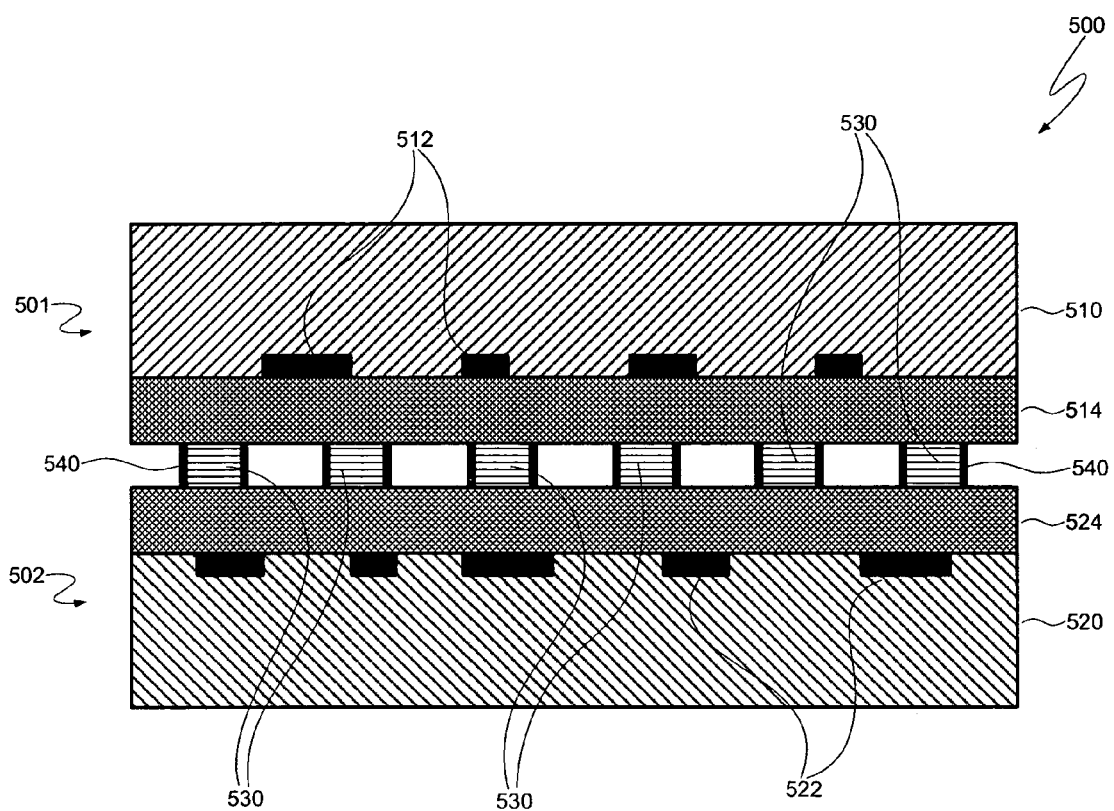
FIG. 5B is a schematic diagram illustrating a cross-sectional view of the wafer stack of FIG. 5A, as taken along line B-B of FIG. 5A.

As previously suggested, the above-described embodiments for forming self-passivating interconnects may be used to bond together semiconductor wafers to form a wafer stack. An embodiment of such a wafer stack 500 is illustrated in FIGS. 5A and 5B, wherein FIG. 5B shows a cross-sectional view of the wafer stack of FIG. 5A, as taken along line B-B of FIG. 5A. Referring to these figures, a wafer stack 500 includes a first wafer 501 and a second wafer 502, each of the wafers 501, 502 comprising a substrate 510, 520, respectively. The substrate 510, 520 of each wafer 501, 502 typically comprises a semiconductor material, such as Silicon (Si), Silicon-on-Insulator (SOI), Gallium Arsenide (GaAs), etc. Integrated circuitry for a number of stacked die 505 has been formed on each of the wafers 501, 502, and the wafer stack 500 is ultimately cut into these separate stacked die 505. The integrated circuitry for each stacked die 505 may include a number of active devices 512 (e.g., transistors, capacitors, etc.) formed on the substrate 510 of first wafer 501 and a number of active devices 522 formed on the substrate 520 of second wafer 502.

Disposed over a surface of first wafer 501 is an interconnect structure 514, and disposed over a surface of the second wafer 502 is an interconnect structure 524. Generally, each of the interconnect structures 514, 524 comprises a number of levels of metallization, each layer of metallization separated from adjacent levels by a layer of dielectric material (or other insulating material) and interconnected with the adjacent levels by vias. The dielectric layers of interconnects 514, 524 are often each referred to as an "interlayer dielectric" (or "ILD"), and the ILD layers may comprise any suitable insulating material, such as $SiO_2$, $Si_3N_4$, CDO, SiOF, or a spun-on material (e.g., a spun-on glass or polymer). The metallization on each layer comprises a number of conductors (e.g., traces) that may route signal, power, and ground lines to and from the integrated circuitry of each die 505, and this metallization comprises a conductive material, such as copper, aluminum, silver, gold, as well as alloys of these (or other) materials.

Disposed between the first and second wafers 501, 502, and both mechanically and electrically coupling these two wafers together, is a number of interconnects 530. Formed over each of the interconnects is a passivation layer 540. According to one embodiment, the interconnects 530 comprise substantially copper, and the passivation layer 540 comprises aluminum. According to another embodiment, the passivation layer comprises aluminum oxide, and in a further embodiment the passivation layer comprises aluminum nitride. In one embodiment, the interconnects are self-passivating, and they are formed according to one or more of the above-described embodiments.

In one embodiment, the first and second wafers 501, 502 have the same size and shape; however, in another embodiment, these wafers have differing shapes and/or sizes. In one embodiment, the first and second wafers 501, 502 comprise the same material, and in a further embodiment, the first and second wafers 501, 502 comprise different materials. Also, although the wafers 501, 502 may be fabricated using substantially the same process flow, in another embodiment, the wafers 501, 502 are fabricated using different process flows. In one embodiment, one of the wafers (e.g., wafer 501) includes logic circuitry formed using a first process flow, and the other wafer (e.g., wafer 502) includes memory circuitry (e.g., DRAM, SRAM, etc.) that is formed using a second, different process flow. Thus, as the reader will appreciate, the disclosed embodiments are applicable to any type of wafer or combination of wafers—irrespective of size, shape, material, architecture, and/or process flow—and, as used herein, the term "wafer" should not be limited in scope to any particular type of wafer or wafer combination.

Ultimately, the wafer stack 500 will be cut into a number of separate stacked die 505, as noted above. Each stacked die will include a die from first wafer 501 and a die from the second wafer 502. These two stacked die will be interconnected—both electrically and mechanically—by some of the interconnects 530.

The above-described embodiments for forming self-passivating interconnects have been explained, at least in part, in the context of forming a three-dimensional wafer stack. However, it should be understood that the disclosed embodiments are not limited in application to wafer stacking and, further, that the disclosed embodiments may find use in other devices or applications. For example, the above-described embodiments may be used to form self-passivating interconnects between a integrated circuit die and a package substrate, and/or to form self-passivating interconnects between a package and a circuit board. The above-described embodiments may also find application to wafer-to-die bonding and to die-to-die bonding.

Figure 6:
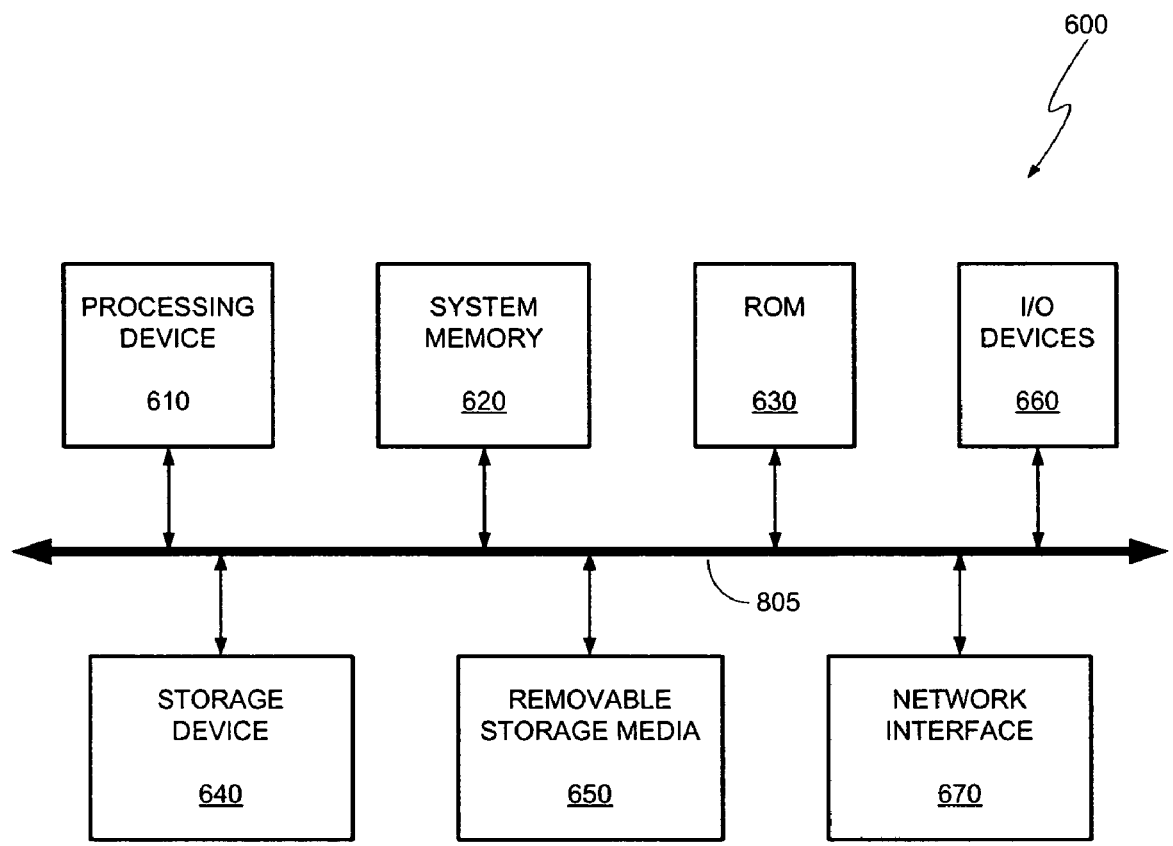
FIG. 6 is a schematic diagram illustrating an embodiment of a computer system, which may include a component formed according to the disclosed embodiments.

Also, it should be noted that, in FIGS. 2A-2D, a limited number of bond structures and interconnects are shown for ease of illustration. Similarly, in FIGS. 5A-5B, only a limited number interconnects 530, as well as active devices 512, 522, are shown for ease of illustration and clarity. However, as the reader will appreciate, the substrates 210, 220 of FIGS. 2A-2D and the semiconductor wafers 501, 502 of FIGS. 5A-5B may include thousands or perhaps millions of such interconnects (230 or 530). Similarly, the integrated circuitry formed on wafers 501, 502 for each stacked die 505 may, in practice, include tens of millions, or even hundreds of millions, of active devices 512, 522 (e.g., transistors). Thus, it should be understood that FIGS. 2A-2D and 5A-5B are simplified schematic representations presented merely as an aid to understanding the disclosed embodiments and, further, that no unnecessary limitations should be drawn from these schematic representations.

Referring to FIG. 6, illustrated is an embodiment of a computer system 600. Computer system 600 includes a bus 605 to which various components are coupled. Bus 605 is intended to represent a collection of one or more buses—e.g., a system bus, a Peripheral Component Interface (PCI) bus, a Small Computer System Interface (SCSI) bus, etc.—that interconnect the components of system 600. Representation of these buses as a single bus 605 is provided for ease of understanding, and it should be understood that the system 600 is not so limited. Those of ordinary skill in the art will appreciate that the computer system 600 may have any suitable bus architecture and may include any number and combination of buses.

Coupled with bus 605 is a processing device (or devices) 610. The processing device 610 may comprise any suitable processing device or system, including a microprocessor, a network processor, an application specific integrated circuit (ASIC), or a field programmable gate array (FPGA), or similar device. It should be understood that, although FIG. 6 shows a single processing device 610, the computer system 600 may include two or more processing devices.

Computer system 600 also includes system memory 620 coupled with bus 605, the system memory 620 comprising, for example, any suitable type and number of memories, such as static random access memory (SRAM), dynamic random access memory (DRAM), synchronous DRAM (SDRAM), or double data rate DRAM (DDRDRAM). During operation of computer system 600, an operating system and other applications may be resident in the system memory 620.

The computer system 600 may further include a read-only memory (ROM) 630 coupled with the bus 605. The ROM 630 may store instructions for processing device 610. The system 600 may also include a storage device (or devices) 640 coupled with the bus 605. The storage device 640 comprises any suitable non-volatile memory, such as, for example, a hard disk drive. The operating system and other programs may be stored in the storage device 640. Further, a device 650 for accessing removable storage media (e.g., a floppy disk drive or a CD ROM drive) may be coupled with bus 605.

The computer system 600 may also include one or more I/O (Input/Output) devices 660 coupled with the bus 605. Common input devices include keyboards, pointing devices such as a mouse, as well as other data entry devices, whereas common output devices include video displays, printing devices, and audio output devices. It will be appreciated that these are but a few examples of the types of I/O devices that may be coupled with the computer system 600.

The computer system 600 may further comprise a network interface 670 coupled with bus 605. The network interface 670 comprises any suitable hardware, software, or combination of hardware and software that is capable of coupling the system 600 with a network (e.g., a network interface card). The network interface 670 may establish a link with the network (or networks) over any suitable medium—e.g., wireless, copper wire, fiber optic, or a combination thereof—supporting the exchange of information via any suitable protocol—e.g., TCP/IP (Transmission Control Protocol/Internet Protocol), HTTP (Hyper-Text Transmission Protocol), as well as others.

It should be understood that the computer system 600 illustrated in FIG. 6 is intended to represent an exemplary embodiment of such a system and, further, that this system may include many additional components, which have been omitted for clarity and ease of understanding. By way of example, the system 600 may include a DMA (direct memory access) controller, a chip set associated with the processing device 810, additional memory (e.g., a cache memory), as well as additional signal lines and buses. Also, it should be understood that the computer system 600 may not include all of the components shown in FIG. 6.

In one embodiment, the computer system 600 includes a component having a stacked die including self-passivating interconnects formed according to one or more of the above-described embodiments. For example, the processing device 610 of system 600 may include such a stacked die with self passivating interconnects. However, it should be understood that other components of system 600 (e.g., network interface 670, etc.) may include a device having a component with self-passivating interconnects.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:
   forming a bond structure on a first substrate, the bond structure of the first substrate including a conductive metal and an element;
   forming a bond structure on a second substrate, the bond structure of the second substrate including the conductive metal and the element; and
   bonding the bond structure of the first substrate to the bond structure of the second substrate to form an interconnect between the first and second substrates, wherein the element migrates to free surfaces of the bond structures to form a passivation layer on the interconnect.

2. The method of claim 1, further comprising performing the bonding in the presence of oxygen, wherein the passivation layer comprises an oxide of the element.

3. The method of claim 1, further comprising performing the bonding in the presence of nitrogen, wherein the passivation layer comprises a nitride of the element.

4. The method of claim 1, further comprising performing the bonding in a vacuum, wherein the passivation layer comprises substantially the element.

5. The method of claim 1, wherein the first substrate comprises a first semiconductor wafer having integrated circuitry for a number of die and the second substrate comprises a second semiconductor wafer having integrated circuitry for a corresponding number of die.

6. The method of claim 1, wherein forming at least one of the bond structures comprises forming the bond structure from an alloy of the conductive metal and the element.

7. The method of claim 1, wherein forming at least one of the bond structures comprises forming a first portion of the bond structure from an alloy of the conductive metal and the element and forming a second portion of the bond structure from substantially the conductive metal.

8. The method of claim 1, wherein the conductive metal comprises copper.

9. The method of claim 1, wherein the element comprises a metal.

10. The method of claim 1, wherein the element comprises a non-metal.

11. The method of claim 1, wherein at least one of the bond structures includes the element and further includes one additional element, wherein the additional element migrates to the free surfaces of the bond structures to form, in combination with the element, the passivation layer.

12. A device comprising:
a first integrated circuit die;
a second integrated circuit die;
a plurality of interconnects extending between the first die and the second die, each of the interconnects including a conductive metal; and
a passivation layer disposed over each of the interconnects, the passivation layer including an element capable of migrating through the conductive metal to free surfaces.

13. The device of claim 12, wherein the passivation layer comprises an oxide of the element.

14. The device of claim 12, wherein the passivation layer comprises a nitride of the element.

15. The device of claim 12, wherein the passivation layer comprises substantially the element.

16. The device of claim 12, wherein the conductive metal comprises copper.

17. The device of claim 16, wherein the element comprises a metal selected from a group consisting of aluminum, tin, cobalt, magnesium, and titanium.

18. The device of claim 12, wherein the element comprises a non-metal.

19. The device of claim 12, wherein the passivation layer includes at least one additional element capable of migrating through the conductive metal to the free surfaces.

20. A method comprising:
forming a plurality of bond pads on a first semiconductor wafer including circuitry for a number of die, each of the bond pads including copper and a second metal;
forming a plurality of bond pads on a second semiconductor wafer including circuitry for a corresponding number of die, each of the bond pads including copper and the second metal; and
bonding each of the plurality of bond pads on the first wafer to a mating one of the plurality of bond pads on the second wafer to form a plurality of interconnects between the first and second wafers, wherein the second metal migrates to free surfaces of the bond pads to form a passivation layer on each of the interconnects.

21. The method of claim 20, wherein the second metal comprises a metal selected from a group consisting of aluminum, tin, cobalt, magnesium, and titanium.

22. The method of claim 20, wherein the passivation layer comprises an oxide of the second metal or a nitride of the second metal.

23. The method of claim 20, further comprising cutting the bonded wafers into a number of stacked die, each stacked die including one die from the first wafer, one die from the second wafer, and some of the interconnects electrically coupling the two die.

24. A method comprising:
forming a bond structure on a first substrate, the bond structure of the first substrate including a conductive metal and an element;
forming a bond structure on a second substrate, the bond structure of the second substrate including the conductive metal; and
bonding the bond structure of the first substrate to the bond structure of the second substrate to form an interconnect between the first and second substrates, wherein the element migrates to free surfaces of the bond structures to form a passivation layer on the interconnect.

25. The method of claim 24, further comprising performing the bonding in the presence of oxygen, wherein the passivation layer comprises an oxide of the element.

26. The method of claim 24, further comprising performing the bonding in the presence of nitrogen, wherein the passivation layer comprises a nitride of the element.

27. The method of claim 24, further comprising performing the bonding in a vacuum, wherein the passivation layer comprises substantially the element.

28. The method of claim 24, wherein forming the bond structure of the first substrate comprises forming the bond structure from an alloy of the conductive metal and the element.

29. The method of claim 24, wherein forming the bond structure of the first substrate comprises forming a first portion of the bond structure from an alloy of the conductive metal and the element and forming a second portion of the bond structure from substantially the conductive metal.

30. The method of claim 24, wherein the element comprises a metal.

31. The method of claim 24, wherein the element comprises a non-metal.

32. The method of claim 24, wherein the bond structure of the first substrate further includes one additional element, wherein the additional element migrates to the free surfaces of the bond structures to form, in combination with the element, the passivation layer.

* * * * *